United States Patent [19]

Kaji et al.

[11] Patent Number: 5,290,993
[45] Date of Patent: Mar. 1, 1994

[54] MICROWAVE PLASMA PROCESSING DEVICE

[75] Inventors: Tetsunori Kaji, Tokuyama; Takashi Fujii; Motohiko Yoshigai, both of Kudamatsu; Yoshinao Kawasaki, Yamaguchi; Masaharu Nishiumi, Kudamatsu, all of Japan

[73] Assignee: Hitachi, Ltd., Tokyo, Japan

[21] Appl. No.: 890,184

[22] Filed: May 29, 1992

[30] Foreign Application Priority Data

May 31, 1991 [JP] Japan .................................. 3-129064

[51] Int. Cl.$^5$ .............................................. B23K 9/00
[52] U.S. Cl. ........................... 219/121.43; 219/121.52; 219/121.48; 156/345; 156/646; 204/298.37
[58] Field of Search ...................... 219/121.43, 121.44, 219/121.48, 121.52; 204/298.34, 298.37, 298.38; 156/345, 646, 643

[56] References Cited

U.S. PATENT DOCUMENTS

| | | | |
|---|---|---|---|
| 4,673,456 | 6/1987 | Spencer et al. | 204/298.38 |
| 4,985,109 | 1/1991 | Otsubo et al. | 204/298.38 |

FOREIGN PATENT DOCUMENTS

| | | | |
|---|---|---|---|
| 0090228 | 7/1980 | Japan | 204/298.38 |
| 2-67632 | 5/1990 | Japan. | |
| 3-242928 | 10/1991 | Japan | 204/298.38 |

Primary Examiner—Mark H. Paschall
Attorney, Agent, or Firm—Antonelli, Terry Stout & Kraus

[57] ABSTRACT

A microwave plasma processing device is composed of a vacuum chamber which is evacuated to a predetermined pressure and into which processing gas is introduced; a sample table disposed in the vacuum chamber to which an AC voltage is applied; a microwave generating apparatus which generates microwaves and introduces the microwaves towards a surface to be processed of a sample located on the sample table; a magnetic field generating apparatus for generating a magnetic field in the vacuum chamber; an insulator disposed on a part exposed to plasma produced in the vacuum chamber; and a ground electrode disposed at a place which is on a microwave introduction side with respect to the surface of the sample table on which the sample is placed. The ground electrode arranged in an insulator exposed to the plasma is protected by covering the surface of the ground electrode by an insulating film which is so thin that application of an AC voltage is not prevented. In this way the AC voltage is applied at a place where efficiency is high, and stable plasma processing can be effected.

27 Claims, 4 Drawing Sheets

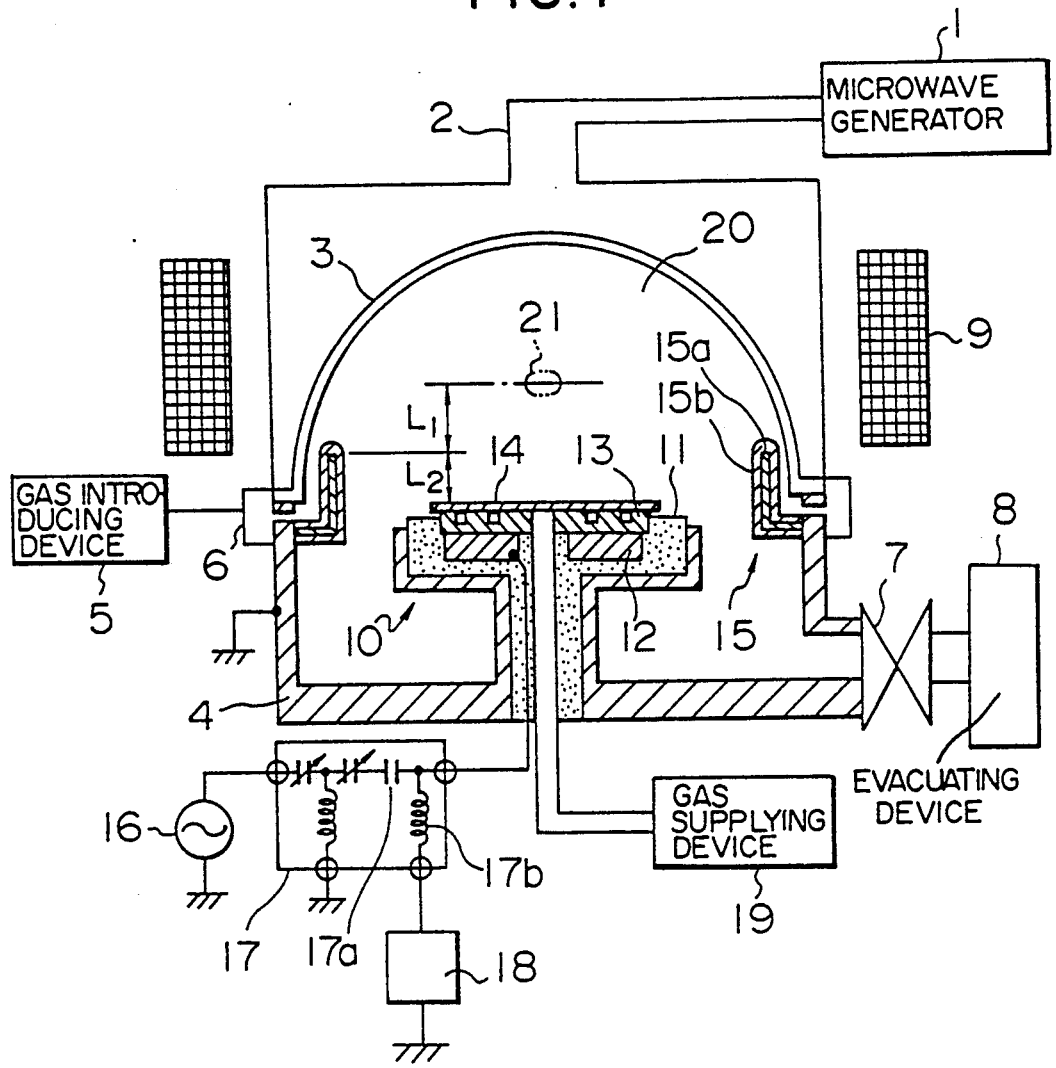
FIG. 1
FIG. 2
FIG. 3
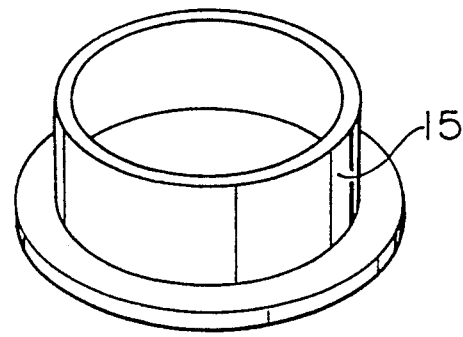

MICROWAVE PLASMA PROCESSING DEVICE

BACKGROUND OF THE INVENTION

The present invention relates to a microwave plasma processing device and in particular to a microwave plasma processing device suitable for formation of various sorts of films, etching processing therefor, etc., effected in semiconductor element fabrication, etc.

Recently, down sizing and higher density integration of semiconductor elements have more and more progressed. A microwave plasma processing device can be cited as a processing device suitable for such down sizing. A prior art microwave plasma processing device described e.g. in Japanese Utility Model Publication Laid-Open No. 2'- 67632 is known. In this microwave plasma processing device, a bell jar made of quartz is disposed in the upper part of a vacuum chamber, in which a sample table is disposed; a waveguide, at an end of which a magnetron is mounted, is disposed around the quartz bell jar; a coil for generating a magnetic field is disposed around the quartz bell jar through the magnetic waveguide; a high frequency power supply is connected with the sample table; and a movable ground plate is disposed around a sample placed on the sample table. The device described above operates as follows. Gas is introduced into the vacuum chamber through a processing gas introducing tube. Microwaves from the magnetron are injected in the quartz bell jar and at the same time a magnetic field is generated in the quartz bell jar. In this way, plasma is produced by the effect of the microwave and the magnetic field in the quartz bell jar, and a bias voltage is produced by applying a high frequency voltage to the sample table. At this time, the height of the ground plate is regulated so that a potential distribution is made uniform.

In the prior art technique described above, no attention was paid to metal contamination by the ground plate, and there was a problem that the ground plate was sputtered by ions in the plasma generated in the quartz bell jar and sputter particles were scattered in the vacuum chamber to contaminate the sample.

The object of the present invention is to provide a microwave plasma processing device capable of effect stable plasma processing without any metal contamination.

SUMMARY OF THE INVENTION

In order to achieve the above object, a microwave plasma processing device according to the present invention comprises a vacuum chamber, which is evacuated to a predetermined pressure and into which processing gas is introduced; a sample table disposed in the vacuum chamber, to which an AC voltage is applied; microwave generating means, which gives rise to microwave oscillation to introduce it towards a surface to be processed of a sample located on the sample table; magnetic field generating means for generating a magnetic field in the vacuum chamber; an insulator disposed on a part exposed to plasma produced in the vacuum chamber; and a ground electrode disposed at a place, which is on the microwave introduction side with respect to the surface of the sample table, on which the sample is placed, the surface of the ground electrode being covered by an insulating thin film.

Since the ground electrode covered by the insulating thin film is disposed on the microwave introduction side with respect to the surface of the sample table, on which the sample is placed, the ground electrode being enclosed by an insulator, even if it is exposed to the plasma, the ground electrode is protected by the insulator. Thus, since the ground electrode is not sputtered, there is no fear of metal contamination. Further, since the insulator for the protection is formed in a thin film and the bias voltage is produced by utilizing an AC voltage, it is possible to have AC electric power provided with a ground potential setting function with respect to the plasma and to effect a stable plasma processing.

BRIEF DESCRIPTION OF THE DRAWINGS

FIG. 1 is a diagram indicating the construction of an embodiment of the microwave plasma processing device according to the present invention;

FIG. 2 is a perspective view showing a ground electrode used in the device indicated in FIG. 1;

FIG. 3 is a plan view showing the arrangement of a plane made of a dielectric substance, on which a sample is placed;

DESCRIPTION OF THE PREFERRED EMBODIMENTS

Figure 4:
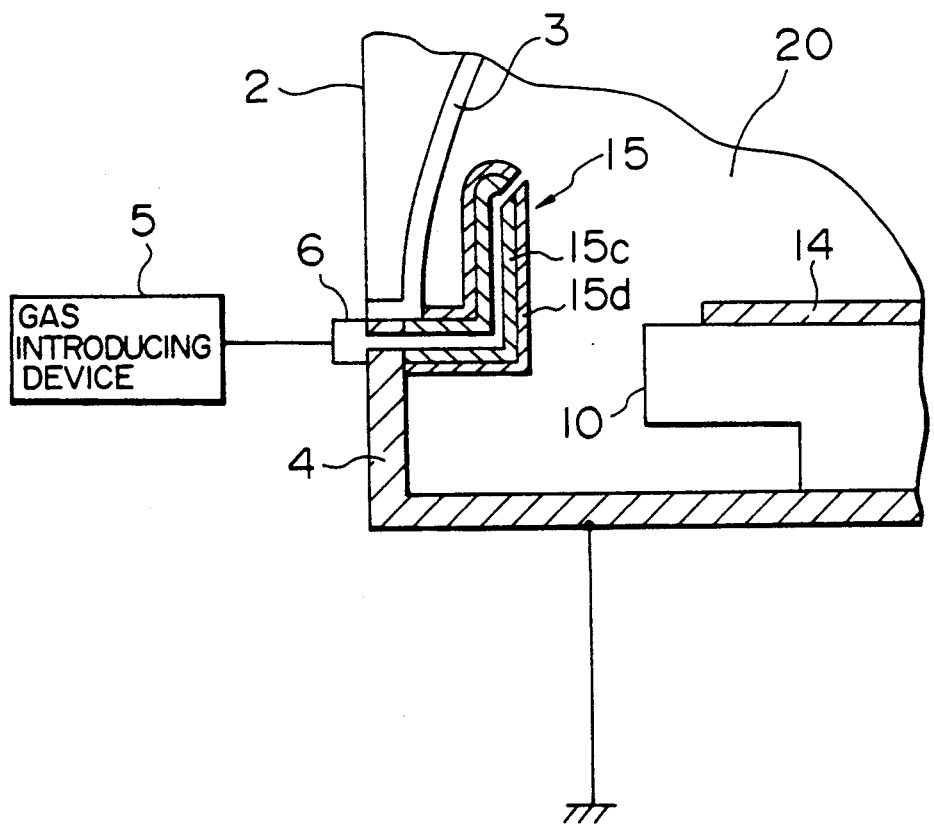
FIG. 4 is a cross-sectional view showing in detail another embodiment of the ground electrode used in the device indicated in FIG. 1.

Hereinbelow an embodiment of the present invention will be explained, referring to FIGS. 1 to 3.

A sample table 10 is disposed in a metal vessel 4. In an upper aperture portion of the metal vessel 4, in this case, a hemispherical quartz bell jar 3 is mounted hermetically to form a vacuum chamber. In the interior of the quartz bell jar 3 a plasma generating space is formed opposite to a surface of the sample table 10, on which a sample is placed.

A ring-shaped ground electrode 15, as indicated in FIG. 2, is mounted in the upper portion of the metal vessel 4 and connected electrically with the grounded metal vessel 4. The ground electrode consists of an electrically conductive metal portion 15a such as aluminum and an insulating layer 15b several tens to several hundreds of micrometers ($\mu$m) thick, covering the outer surface thereof and made of e.g. alumina. At the place where the insulator 15b is formed a potential difference is produced with respect to AC. However, it is possible to keep this potential difference at a small value at a frequency of AC above about 100 kHz (including several tens of kHz below 100 kHz), if $d/\xi\gamma$ 1 mm is satisfied, where $\xi\gamma$ denotes the specific dielectric constant of the material constituting the insulator 15b having a thickness of d (mm).

The lower part of the ground electrode 15 is formed in a flange shape, which is secured to the metal vessel 4 so that there is a gap between the ground electrode 15 and the inner surface of the metal vessel 4 as well as the quartz bell jar 3. A gas buffer 6 connected with a processing gas supplying device 5 is disposed on the peripheral portion of the metal vessel 4 and a path is formed so that the gas buffer 6 is connected with the ga between the quartz bell jar 3 and the ground electrode 15. An evacuating device 8 is connected with the lower portion of the metal vessel 4 through a valve 7.

A waveguide 2 is disposed in the upper part of the metal vessel 4 so as to surround the quartz bell jar 3 and a magnetron 1 is mounted on an end portion of the waveguide 2. In this case the microwave generating means is composed of the magnetron 1 and the waveguide 2. A solenoid coil 9 serving as the magnetic field generating means is wound on the outer periphery of the quartz bell jar 3 through the waveguide 2.

In this case the sample table 10 is composed of an insulator 11, an electrode 12 and a dielectric body 13. The electrode 12 is enclosed by the dielectric body 13 and the insulator 11 and a sample 14 is located on the upper surface of the dielectric body 13. In this case a DC power supply 18 for electrostatic attraction and an AC power supply 16 for bias application are connected with the electrode 12 through a matching device 17. The DC power supply 18 is connected therewith through a circuit element 17b consisting of an inductance or a resistor for cutting-off high frequencies in the matching device 17. The AC power supply 16 is connected therewith through a circuit element 17a consisting of a capacitor. A gas flow path connected with the plane of the dielectric body 13, on which the sample is placed, is formed in the sample table 10 and the gas flow path is connected with a gas supplying device 19 on the other hand. In this case a cross-shaped groove and a plurality of ring-shaped grooves are formed on the plane, on which the sample is placed, as indicated in FIG. 3, so that a thermally conductive gas such as e.g. He gas is supplied uniformly to the rear surface of the sample 14. In this way it is possible to control the temperature of the sample 14 by disposing the gas flow path for making a heating or cooling medium flow to the sample table 10, although this is not indicated in the figures.

In the microwave plasma processing device constructed as described above, a processing gas, e.g. an etching gas, supplied from the processing gas supplying device 5 is supplied uniformly at a plurality of places on the inner periphery of the metal vessel 4 through the gas buffer 6, rises upward along the inner surface of the quartz bell jar 3, and is evacuated downward from the vacuum chamber. The pressure in the vacuum chamber is kept at a predetermined level by the evacuating device. In this state, microwaves of 2.45 GHz in this case are produced by the magnetron 1. Microwave power thus produced is introduced into the vacuum chamber through the waveguide 2 and the quartz bell jar 3. On the other hand a magnetic field having a magnetic field intensity of 875 gauss in this case is formed in the vacuum chamber by the solenoid coil 9 so that magnetic lines of force are approximately perpendicular to the sample 14. Plasma of the etching gas is produced in a plasma generating space 20 formed in the quartz bell jar 3 by the effect of the microwave and the magnetic field. In the plasma produced in the plasma generating space 20, high density plasma is produced at an area, on which the microwaves of 2.45 GHz and the magnetic field of 875 gauss act, i.e. at an ECR (ECR : Electron Cyclotron Resonance) region 21.

A high frequency voltage of several tens of kHz to several tens of MHz is applied between the electrode 12 and the ground electrode 15 by the AC power supply 16 through the matching device 17. Since the ground electrode 15 is located at a place where the plasma is relatively intense, the potential difference between the intense plasma and the ground electrode 15 is small and thus the high frequency voltage can be applied stably between the plasma and the sample with a high efficiency, i.e. without fluctuations. The application of this high frequency voltage gives rise to a bias voltage and thus ions in the plasma can be pulled towards the sample 14 in a uniform direction and it is possible to perform stably an anisotropic etching with a high rate. According to an experiment, it was found that the plasma can be formed stably without fluctuations if the ground electrode is set at such a position that the distance $L_1$ from the ECR region 21 to the upper portion of the ground electrode 15 is approximately equal to $\frac{1}{4}$, or $\frac{1}{4}$ multiplied by an integer, of the guide wavelength $\lambda g$ of the microwave. Further, it is preferable that the distance $L_2$ from the upper portion of the ground electrode 15 to the sample 14 is set at about $(n+1) \cdot \lambda g/2$, where n is an integer such as 0, 1, 2, . . . . Here, for the magnitude of $L_1$ and $L_2$, since the insulating layer 15b on the ground electrode is extremely thin, the insulating layer 15b can be neglected. Further, it is preferable that the surface area of the ground electrode 15 is greater than the superficial area of the sample 14.

Furthermore, since the ground electrode 15 is covered by the insulating layer 15b made of alumina, etc., which is as thin as several tens to several hundreds of micrometers so that it has no influence on the application of the high frequency voltage, the metal 15a constituting the ground electrode is not exposed directly to the plasma. Since it is not subjected to sputter, etc., by ions in the plasma, the metal is not consumed by the plasma and thus it is possible to prevent metal contamination.

According to an embodiment described above, since the ground electrode covered by the insulating layer, which is so thin that it has no influence on the application of the high frequency voltage, is located in the neighborhood of the place where intense plasma is generated in the plasma generating space surrounded by the insulator, i.e. it is located on the microwave introduction side with respect to the plane of the sample table on which the sample is placed, so as to surround the sample table, the ground electrode is not consumed by the plasma. Thus, it is possible to obtain a stable plasma having no fluctuations in the intensity of the plasma and to effect a stable plasma processing without any metal contamination.

Further, since a part of the ground electrode 15 constitutes a part of the gas introduction path so that the processing gas is supplied to the upper portion along the inner surface of the quart bell jar 3 and made flow from the upper to the lower portion of the vacuum chamber, the gas is supplied to the neighborhood of the place where intense plasma is produced, and always new processing gas is supplied thereto. In this way a processing can be effected with a high efficiency, i.e. with a high rate.

Although in the present embodiment the ECR region 21 has been described as an area where microwaves of 2.45 GHz and magnetic field of 875 gauss act as an example, this is not limited thereto because the intensity of the magnetic field satisfying the ECR condition varies, if the frequency of the microwaves vary.

Although in the present embodiment the waveguide 2 has been used in this case as means for conveying microwaves from the magnetron 1 into the quartz bell jar, a coaxial cable, etc., may be used instead thereof. Further, the waveguide 2 includes means for monitoring incident and reflected waves by means of an isolator or a directional coupler, etc., although they are omitted in the figures.

Furthermore, although in the present embodiment the processing gas was supplied by flowing to the upper portion of the quartz bell jar 3 through the gap between the ground electrode 15 and the quartz bell jar 3, the gas flow path may be formed in a metal portion 15c of the ground electrode 15 as indicated in FIG. 4 so that the processing gas flows towards the upper portion of the quartz bell jar 3. Also, for the ground electrode 15 indicated in FIG. 4, an insulating layer 15d is formed on the surface of the metal portion 15c.

Next, another embodiment of the present invention will be explained, referring to FIGS. 5 and 6.

In these figures, the reference numerals identical to those used in FIG. 1 represent the same members and explanation thereof will be omitted. What is different in the device in these figures from that indicated in FIG. 1 is that the upper portion of the ground electrode is formed in a mesh shape, that the gas buffer for supplying the processing gas is formed within the metal vessel, and that only the AC power is applied to the sample table 10. The ground electrode 22 includes a mesh-shaped metal portion on a plane opposite to the surface of the sample 14 to be processed. In this case, the distance $L_1$ between the place where the intensity of the magnetic field gives rise to ECR (ECR region 21) and the distance $L_2$ between the mesh and the surface of the sample 14 to be processed are determined in the manner identical to that used in the embodiment indicated in FIG. 1 to 3. It is desirable that the pitch of the mesh is greater than 10 mm so as not to obstruct ions, particles, etc. The shape of the mesh is not limited to a rectangle as indicated in FIG. 6, but a mesh consisting of rings having different radii in the peripheral direction and a cross in the radial direction made of metal, etc., may be used. The ground electrode 22 is covered by an insulating thin film similar to that used in the embodiment indicated in FIGS. 1 to 3.

Figure 5:
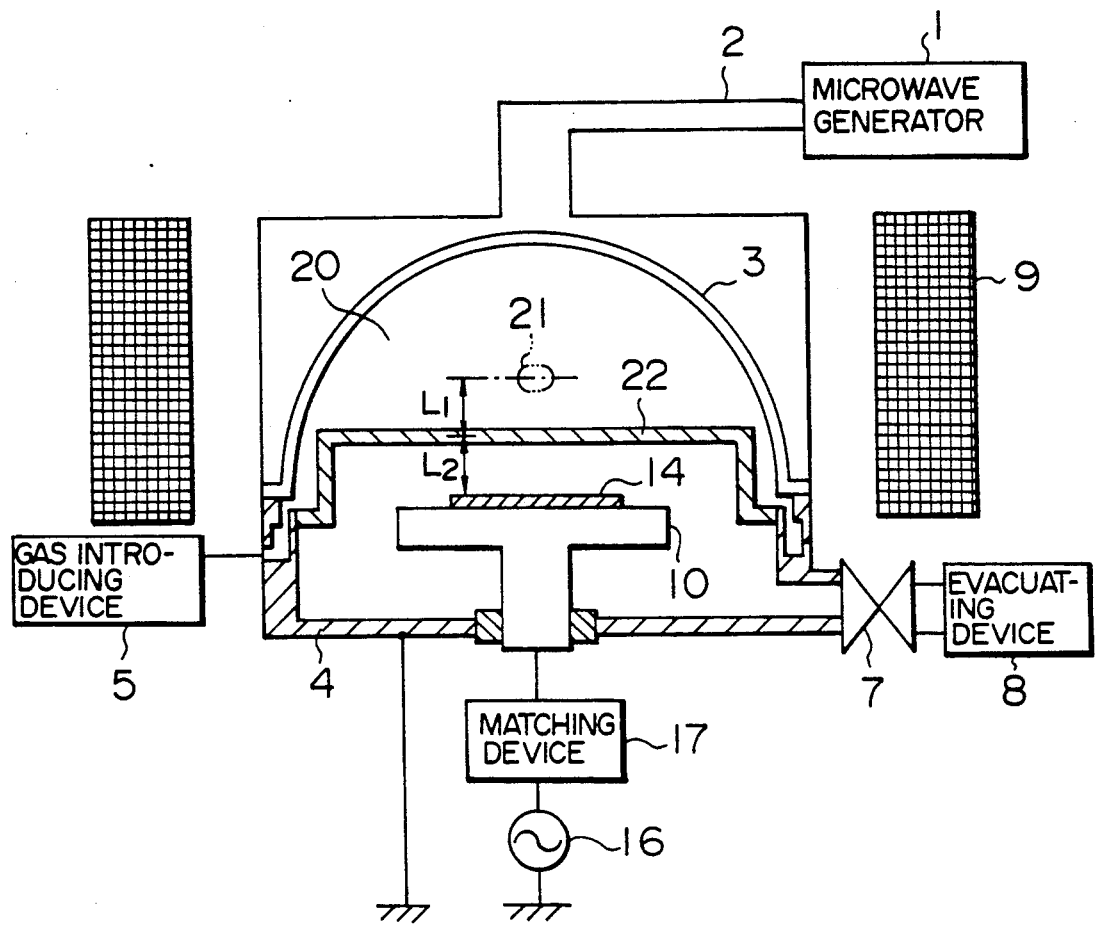
FIG. 5 is a diagram indicating the construction of another embodiment of the microwave plasma processing device according to the present invention.
Figure 6:
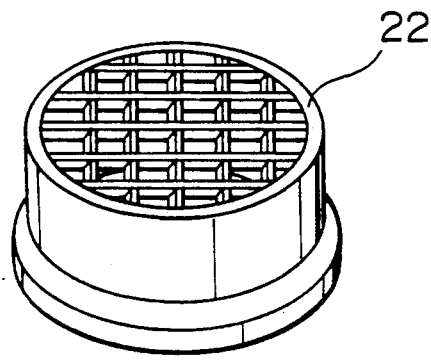
FIG. 6 is a perspective view showing a ground electrode used in the device indicated in FIG. 5.

According to the embodiment thus constructed and indicated in FIGS. 5 and 6, effects similar to those described for the embodiment indicated in FIGS. 1 to 3 are obtained and since it is possible to apply AC electric power to the whole area of the plasma, a more stable plasma can be obtained.

It may happen that a shadow of the mesh is transferred to the surface of the sample 14 due to the fact that the mesh-shaped ground electrode 22 is disposed above the sample 14. This can be avoided by superposing an AC current on the DC flowing through the solenoid coil 9 to displace ions also transversally.

Next, still another embodiment of the present invention will be explained, referring to FIGS. 7 and 8. In these figures, the reference numerals identical to those used in FIG. 1 represent the same members and explanation thereof will be omitted. The vacuum chamber is composed of a metal vessel 33 and a plate 34 made of quartz mounted hermetically on an aperture in the upper portion of the metal vessel 33. An insulating layer 35 is disposed on the surface of the part forming the plasma generating space 20 in the upper portion of the metal vessel 33. The sample table 10 is formed so as to be extended to the space where the insulating layer 35 is disposed in the metal vessel 33. A waveguide 32 is disposed on the metal vessel 33 covering a quartz window 34 and extending upward and the magnetron 31 is mounted on the upper end portion of the waveguide 33. A gas buffer is formed in the upper portion of the metal vessel 33 so that the processing gas can be supplied from the processing gas supplying device 5 to the upper portion of the discharge space. The evacuating device 8 is connected with the lower portion of the metal vessel 33 through the valve 7. A solenoid coil 36 is wound on the outer periphery of the upper portion of the metal vessel 33. A ground electrode 37 is mounted with the metal vessel 33 disposed to the microwave introduction side with respect to the surface of the sample table on which the sample is placed, and is formed as a doughnut-shaped plate. The ground electrode 37 is connected electrically with the grounded metal vessel 33. The position of the ground electrode 37 is determined by the distances $L_1$ and $L_2$ from the ECR region 21 and the surface of the sample 14 to be processed similarly to the mesh in the embodiment indicated in FIGS. 5 and 6 described previously. The outer surface of the ground electrode 37 is covered by a thin insulating film similarly to the embodiment indicated in FIGS. 1 to 3.

In the device constructed as described above, the processing gas is supplied directly to the upper portion of the plasma generating space and flows downward to be evacuated there. In this way the pressure is reduced to a predetermined value and kept at that value. In this state, the microwaves and the magnetic field are made act thereon to generate plasma similarly to the embodiment indicated in FIGS. 1 to 3. At this time, since the upper portion of the ground electrode 37 is formed as a doughnut-shaped plate, the contact area with the plasma at the distance $L_2$ from the ECR region 21 is increased and it is possible to apply AC electric power to a wide region of the plasma to stabilize the plasma.

As described above, according to the present invention, since effects similar to those obtained by the embodiment indicated in FIGS. 1 to 3 are obtained and it is possible to apply AC electric power to a wide region of the plasma, a more stable plasma can be obtained.

Figure 7:
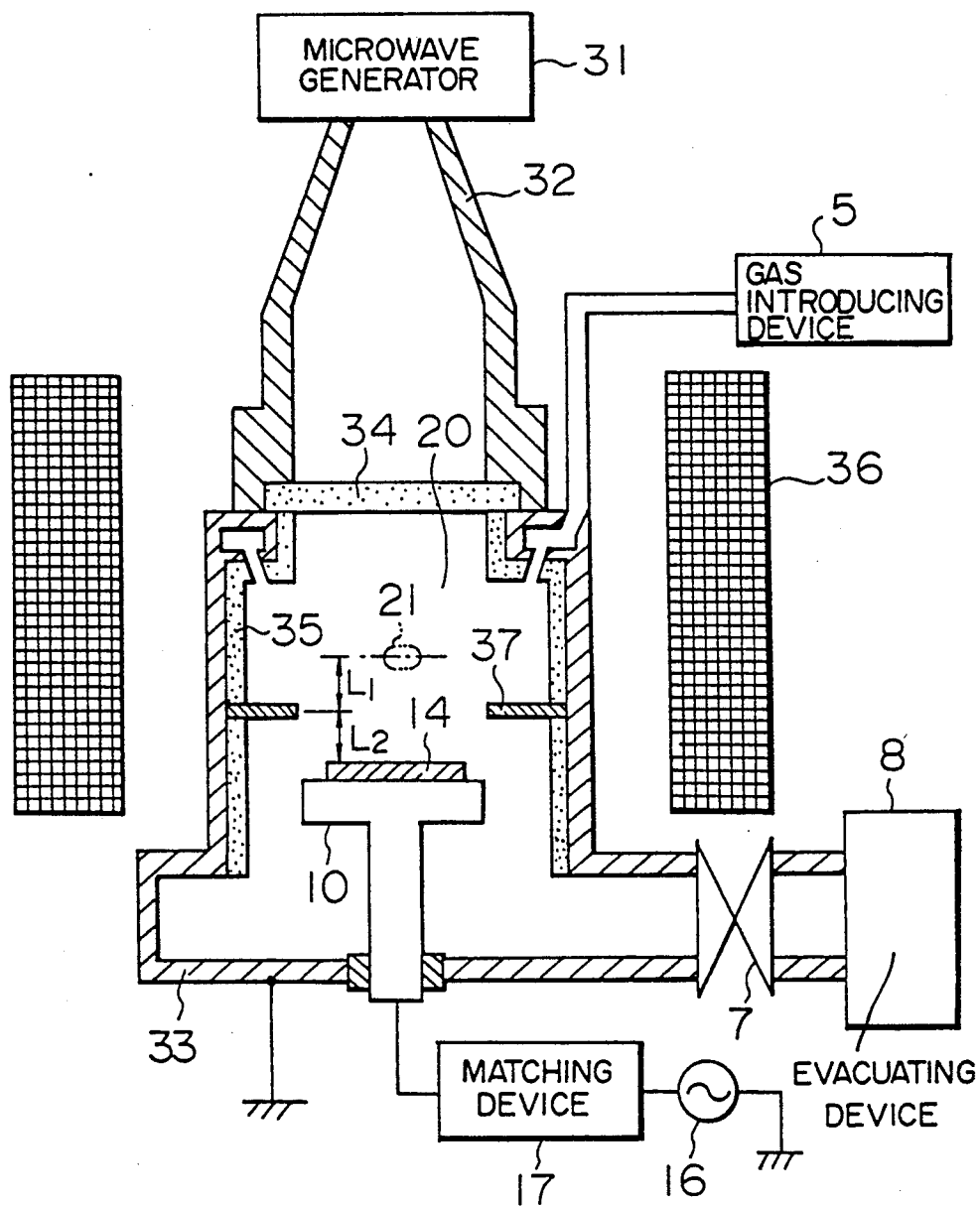
FIG. 7 is a diagram indicating the construction of still another embodiment of the microwave plasma processing device according to the present invention.
Figure 8:
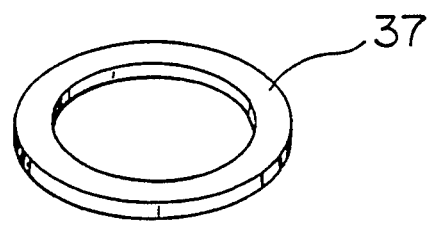
FIG. 8 is a perspective view showing a ground electrode used in the device indicated in FIG. 7.

Further, as indicated in these embodiments, it is possible to apply AC electric power to the plasma without any metal contamination with a high efficiency not only for the device in which the periphery of the part where discharge takes place is surrounded by an insulating layer, as indicated in FIG. 1, but also for the device in which the periphery of the part where discharge takes place is surrounded by metal, as indicated in FIG. 7, by disposing the ground electrode whose surface is covered by an insulating thin film on the microwave introduction side with respect to the surface of the sample table on which the sample is placed.

Although in these embodiments examples were shown in which etching processing is effected by using etching gas as the processing gas, the present invention can be applied to a sputtering device, a film forming device such as a CVD device, etc., by changing the processing gas.

According the present invention, an effect that stable plasma processing can be effected without any metal contamination is obtained.

We claim:

1. A microwave plasma processing device comprising:

a vacuum chamber which is evacuated to a predetermined pressure and into which processing gas is introduced;

a sample table disposed in said vacuum chamber, to which an AC voltage is applied;

microwave generating means for generating microwaves and introducing the microwaves towards a surface to be processed of a sample located on said sample table;

magnetic field generating means for generating a magnetic field in said vacuum chamber;

an insulator disposed on a part of said vacuum chamber exposed to plasma produced in said vacuum chamber; and a ground electrode disposed at a place which is on a microwave introduction side with respect to the surface of said sample table on which said sample is placed, a surface of said ground electrode being covered by an insulating thin film.

2. A microwave plasma processing device according to claim 1, wherein said insulating thin film is less than 1 mm thick.

3. A microwave plasma processing device according to claim 1, wherein said processing gas is introduced into the microwave introduction side, passing along an inner periphery of said insulating thin film.

4. A microwave plasma processing device according to claim 1, wherein said ground electrode is ring-shaped.

5. A microwave plasma processing device according to claim 1, wherein said ground electrode is formed as a doughnut-shaped plate on the microwave introduction side thereof of said sample table.

6. A microwave plasma processing device according to claim 1, wherein said ground electrode is formed as a mesh disposed opposite to said sample table on the microwave introduction side thereof.

7. A microwave plasma processing device according to claim 1, wherein a distance between said ground electrode and an ECR region is approximately equal to $\lambda g/2$ or $\lambda g/2$ multiplied by an integer.

8. A microwave plasma processing device according to claim 1, wherein a distance between said ground electrode and said sample is approximately equal to $(n+1)\lambda g/2$.

9. A plasma processing apparatus comprising:
a vacuum chamber evacuated to a predetermined pressure and into which a processing gas is introduced;

ionization means for ionizing the processing gas in the vacuum chamber to produce a plasma in the vacuum chamber;

a sample table disposed in the vacuum chamber for holding a sample having a surface to be treated by the plasma;

an electrode member disposed apart from the sample table and having a surface facing the plasma in the vacuum chamber;

bias means connected between the sample table and the electrode member for generating a voltage difference between the sample held on the sample table and the electrode member; and protection means mounted over the surface of the electrode member facing the plasma for preventing the surface of the electrode member facing the plasma from being affected by the plasma.

10. A microwave plasma processing device according to claim 9, wherein the protection means includes a thin film of alumina.

11. A plasma processing apparatus comprising:
a vacuum chamber;

means for evacuating the vacuum chamber to a predetermined pressure;

means for introducing a processing gas into the vacuum chamber while the evacuating means maintains the vacuum chamber at the predetermined pressure;

means for generating a plasma in the vacuum chamber from the processing gas in the vacuum chamber;

a sample table disposed in the vacuum chamber for holding a sample to be subjected to plasma processing by the plasma;

an electrode disposed in the vacuum chamber apart from the sample table and having a surface facing the plasma;

means for establishing a bias voltage between a sample held on the sample table and the electrode such that ions in the plasma are attracted to the sample, thereby subjecting the sample to plasma processing by the plasma; and means for preventing the surface of the electrode facing the plasma from being affected by the plasma.

12. A microwave plasma processing device according to claim 11, wherein a portion of the vacuum chamber facing the plasma is made of an insulating material.

13. A microwave plasma processing device according to claim 11, wherein a portion of the vacuum chamber facing the plasma is made of metal and has an insulating layer disposed thereon for preventing the metal from being affected by the plasma.

14. A microwave plasma processing device according to claim 11, wherein the electrode is grounded, and wherein the establishing means includes means for applying a voltage to the sample table, thereby applying the voltage to the sample held on the sample table and establishing a bias voltage between the sample held on the sample table and the grounded electrode.

15. A microwave plasma processing device according to claim 14, wherein the applying means applies an AC voltage to the sample table.

16. A microwave plasma processing device according to claim 11, wherein the preventing means includes an insulating layer disposed on the surface of the electrode facing the plasma.

17. A plasma processing apparatus according to claim 16, wherein the insulating layer has a thickness of less than 1 mm.

18. A microwave plasma processing device according to claim 16, wherein the insulating layer is made of alumina.

19. A microwave plasma processing device according to claim 16, wherein the introducing means introduces the processing gas into the vacuum chamber such that the processing gas flows along a portion of the insulating layer.

20. A microwave plasma processing device according to claim 11, wherein the electrode has a gas flow path formed therein, and wherein the introducing means introduces the processing gas into the vacuum chamber through the gas flow path in the electrode.

21. A microwave plasma processing device according to claim 11, wherein the electrode includes a ring-shaped portion.

22. A microwave plasma processing device according to claim 11, wherein the electrode is a doughnut-shaped plate.

23. A microwave plasma processing device according to claim 11, wherein the electrode includes a mesh-shaped portion disposed between the sample table and a region in the vacuum chamber where the plasma is generated.

24. A microwave plasma processing device according to claim 11, wherein the plasma generating means includes:

means for generating microwaves;

means for introducing the microwaves into the vacuum chamber such that the microwaves propagate towards the sample table; and means for generating a magnetic field in the vacuum chamber;

wherein the microwaves and the magnetic field interact with the processing gas in the vacuum chamber to generate the plasma in the vacuum chamber.

25. A plasma processing apparatus according to claim 24, wherein the microwaves and the magnetic field interact with the processing gas to generate the plasma by electron cyclotron resonance (ECR) in an ECR region in the vacuum chamber.

26. A plasma processing apparatus according to claim 25, wherein a distance between the electrode and the ECR region is approximately equal to $n\lambda g/2$, wherein n is a positive integer and $\lambda g$ is a guide wavelength of the microwaves.

27. A plasma processing apparatus according to claim 25, wherein a distance between the electrode and the sample is approximately equal to $(n+1)\lambda g/2$, wherein n is a non-negative integer and $\lambda g$ is a guide wavelength of the microwaves.

* * * * *